US006943713B1

(12) United States Patent
Pitot et al.

(10) Patent No.: US 6,943,713 B1
(45) Date of Patent: Sep. 13, 2005

(54) PROCESS AND DEVICE FOR THE SEQUENTIAL ADDRESSING OF THE INPUTS OF A MULTIPLEXER OF A DATA ACQUISITION CIRCUIT

(75) Inventors: Christian Pitot, Boulogne Billancourt (FR); Jean-Michel Chopin, Merignac (FR)

(73) Assignee: Thomson-CSF Sextant, Velizy Villacoublay (FR)

( * ) Notice: Subject to any disclaimer, the term of this patent is extended or adjusted under 35 U.S.C. 154(b) by 0 days.

(21) Appl. No.: 09/673,666

(22) PCT Filed: Mar. 10, 2000

(86) PCT No.: PCT/FR00/00593

§ 371 (c)(1), (2), (4) Date: Jun. 12, 2000

(30) Foreign Application Priority Data

Mar. 12, 1999 (FR) ........................................... 99 03089

(51) Int. Cl.[7] ................................................ H03M 1/00

(52) U.S. Cl. ....................................... 341/141; 370/263

(58) Field of Search ........................... 341/141, 26, 33, 341/116, 117, 176, 190, 143, 32, 53, 132; 370/263, 266, 269, 264, 442

(56) References Cited

U.S. PATENT DOCUMENTS 3,651,463 A * 3/1972 Rawson et al. ............... 341/26
3,780,272 A * 12/1973 Rohner ....................... 701/201
3,836,909 A * 9/1974 Cockerell .................... 341/26
3,843,877 A * 10/1974 Roselle et al. .............. 708/809
3,854,036 A * 12/1974 Gupta et al. ........... 235/462.19
4,031,373 A * 6/1977 Beckwith .................... 377/110
4,050,062 A * 9/1977 Crocker et al. ............. 341/141
4,320,683 A * 3/1982 Whitefield ................... 84/115
4,417,234 A * 11/1983 McKenna ................... 341/141
4,502,039 A * 2/1985 Vercesi et al. ................ 341/26
4,636,964 A * 1/1987 Jacobs et al. ............... 700/298
4,654,632 A * 3/1987 Yoshida et al. ............. 341/141
4,739,311 A * 4/1988 Yamamoto et al. ......... 341/176
4,887,082 A * 12/1989 Yamada ....................... 341/26
4,916,446 A * 4/1990 Yamamoto ............. 340/825.57
5,173,696 A * 12/1992 Howard et al. ............. 341/117
5,321,404 A * 6/1994 Mallinson et al. .......... 341/169
5,375,208 A 12/1994 Pitot
5,506,700 A * 4/1996 Nishimura .................. 358/468
5,701,315 A 12/1997 Pitot et al.
5,719,577 A 2/1998 Pitot et al.
6,046,644 A 4/2000 Pitot et al.

* cited by examiner

*Primary Examiner*—Micheal Tokar
*Assistant Examiner*—Linh Van Nguyen
(74) *Attorney, Agent, or Firm*—Oblon, Spivak, McClelland, Maier & Neustadt, P.C.

(57) ABSTRACT

The systematic, and possibly repeated, acquisition of several distinct quantities for exploitation by a user system by utilizing a multiplexer with staged architecture without all inputs hard-wired. Each multiplexer stage is addressed by an elementary counter chained with elementary counters for addressing lower stages. The multiplexer inputs are scanned by regularly incrementing the chain of counters. If no precaution is taken, all the multiplexer inputs are scanned without considering their possible absences. To remedy this drawback a first elementary counter addresses the first stage of adjustable counting capacity switches, the elementary counters can address intermediate stages of the switches with controllable shunting circuits, and a global counter is reconfigured, at the end of each counting cycle of the first elementary counter, by commands adjusting the first elementary counter capacity, and activating or inhibiting the shunting circuits. The stored commands are a string of instructions executed one by one.

12 Claims, 4 Drawing Sheets

PROCESS AND DEVICE FOR THE SEQUENTIAL ADDRESSING OF THE INPUTS OF A MULTIPLEXER OF A DATA ACQUISITION CIRCUIT

BACKGROUND OF THE INVENTION

1. Field of the Invention

The present invention relates to the acquisition of several distinct quantities with a view to their exploitation by a user system. It concerns, more particularly, but not exclusively, the acquisition of analogue quantities with a view to their exploitation by a digital processing system.

2. Discussion of the Background

In order to operate, numerous electronic systems for digital processing require periodic acquisitions of several distinct analogue quantities of diverse origins. These acquisitions are usually effected by means of a sampling analogue/digital converter equipped at the input with an analogue multiplexer with multiple inputs. The analogue multiplexer is addressed monotonically, by way of one or more chained counters which count at the sampling and conversion rate of the analogue/digital converter so as to have all of its inputs scanned periodically.

When the number of analogue quantities to be taken into account by the user system is sizeable, the analogue multiplexer has a staged architecture so as to reduce the number of switches necessary to service all its inputs. In order to cater for periodic scanning of the inputs of an analogue multiplexer with staged architecture, it is customary to address each stage of switches of the multiplexer by means of an elementary counter, to place the various elementary counters in series and to increment them by applying, at a regular rate, pulses to the counting input of the elementary counter of lowest weight, the elementary counters of higher weights being incremented by means of the overflow pulses of the counters of immediately lower weight.

This poses a problem insofar as the staged architecture of an analogue multiplexer is rarely used in a complete manner, this use depending on the context, that is to say on the number of analogue quantities whose exploitation is actually necessary to the relevant user system. Thus, fairly frequently a certain number of inputs of a multiplexer with staged architecture are not used, these inputs possibly not being hard-wired and the switches assigned solely to these unused inputs possibly themselves being absent.

Use of the customary method of addressing leads to systematic scanning of all the inputs of the multiplexer which are rendered possible by the staged architecture, whether or not these inputs are used and whether or not they are hard-wired. This results in needless data acquisition operations which slow down the consideration of the useful data and needlessly load the operating system.

SUMMARY OF THE INVENTION

The aim of the present invention is a mode of addressing a multiplexer with staged architecture, addressed at the level of each stage by an elementary counter chained to the elementary counters of the lower stages, allowing scanning of the inputs of the multiplexer involving only the inputs actually used, so as to avoid needless operations.

Its subject is a process for the sequential addressing of the inputs of a multiplexer which comprises several stages of switches from its inputs to its output and which is addressed at the level of each stage of switches by an elementary counter provided with a counting input, with a reinitialization input, with counting outputs controlling the switches of the relevant stage and with an overflow output, and chained to the elementary counters of the lower stages of switches by linking its counting input to the overflow output of the elementary counter of the lower stage so as to constitute a global addressing counter. This process consists in using, for the addressing of the stage of switches of a lower level closest to the inputs of the multiplexer, an elementary counter having a capacity or counting cycle length which can be adjusted on command, in providing controllable circuits for shunting the elementary counters of the stages of intermediate switches, in periodically generating a counting order for the counting input of the elementary counter of the stage of switches of lower level so as to make it describe successive counting cycles, in altering the configuration of the global addressing counter, at the start of each of the counting cycles of the elementary counter of the stage of switches of lower level, by acting on the length of the forthcoming counting cycle of this elementary counter of the stage of switches of lower level as well as on the in-activity shunting circuits of the elementary counters of the stages of intermediate switches.

Advantageously, the addressing process uses, to define the successive reconfigurings of the global counter for addressing the multiplexer occurring in the course of a scanning sequence for the inputs of the multiplexer, a string of instructions written in a binary reconfiguring language comprising code words for adjusting the length of the counting cycle of the elementary counter catering for the addressing of the stage of switches of lower level and code words for activating or inhibiting the shunting circuits of the elementary counters catering for the addressing of the stages of intermediate switches.

Advantageously, the language for reconfiguring the global counter for addressing the multiplexer also comprises code words for activating or inhibiting a mode for repeating or for retaining the length of the counting cycle of the elementary counter catering for the global addressing of the stage of switches of lower level and a repetition code word valid only when the repetition mode is active.

Advantageously, the language for reconfiguring the global counter for addressing the multiplexer comprises an end code word indicating the end of a string of configuration instructions.

Advantageously, the various code words of the language for reconfiguring the global counter for addressing the multiplexer are binary code words of variable lengths, the code words most frequently used having the shortest lengths.

Advantageously, the various binary code words of the language for reconfiguring the global counter for addressing the multiplexer all begin with a 0 with the exception of the code word of the repetition mode.

Advantageously, the repetition code word in the language for reconfiguring the global counter for addressing the multiplexer is logical 0.

Advantageously, the code word for inhibiting the repetition mode in the language for reconfiguring the global counter for addressing the multiplexer is logical 1.

Advantageously, the code word for activating the repetition mode in the language for reconfiguring the global counter for addressing the multiplexer is binary 01.

Advantageously, in the case of a multiplexer with three stages of switches, the code words for activating and for inhibiting the circuit for shunting the elementary counter addressing the second stage of switches in the language for reconfiguring the global counter for addressing the multiplexer coincide and are expressed by the binary word with four bits 0001, this binary word signifying a change of the active or inactive state of the shunting circuit of the elementary counter addressing the second stage of switches.

Advantageously, the end code word in the language for reconfiguring the global counter for addressing the multiplexer is a string of binary, zeroes.

This mode of addressing the stages of switches of the multiplexer with the aid of a chain of elementary counters comprising an elementary counter for the first stage with adjustable capacity and controllable circuits for shunting the elementary counters of the intermediate stages makes it possible to adapt the scanning of the inputs of the multiplexer to the configuration actually used in a given application while affording appropriate modifications to the general configuration of the addressing counter as the counting proceeds. Furthermore, the addressing control language proposed has the advantage of making it possible to define a scanning sequence for the inputs of the multiplexer with the aid of a particularly compact string of binary words, while accommodating a great diversity of configurations in respect of the inputs of the multiplexer.

The subject of the invention is also an addressing device for a multiplexer having a staged architecture with several stages of switches from its input to its output, which device is provided with a counter consisting of a chaining of elementary counters each addressing a stage of switches of the multiplexer. This device is noteworthy in that it comprises an addressing counter with an elementary counter having counting capacity which can be adjusted on command for the stage of switches of lower level closest to the inputs of the multiplexer and with controllable circuits for shunting the elementary counters of the stages of intermediate switches, and a handler running a sequence of commands for reconfiguring the counter in the course of the accomplishment of its counting cycle.

BRIEF DESCRIPTION OF THE DRAWINGS

Other advantages and characteristics of the invention will emerge from the description hereinbelow of several implementational examples. This description will be made with regard to the drawing in which.

- a FIG. 1 shows the customary architecture of an electronic device for the acquisition of several analogue quantities with a view to their exploitation by an electronic digital processing system,
- a FIG. 2 is a block diagram of a sequencing handler according to the invention, provided so as to cater for the control of an acquisition device such as that of FIG. 1.

DESCRIPTION OF THE PREFERRED EMBODIMENTS

Figure 1:
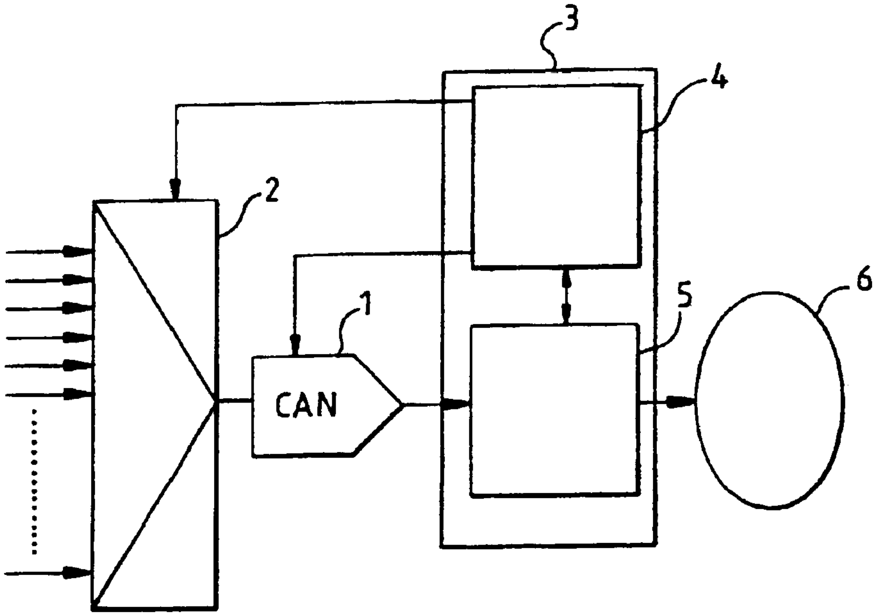
Figure 2:
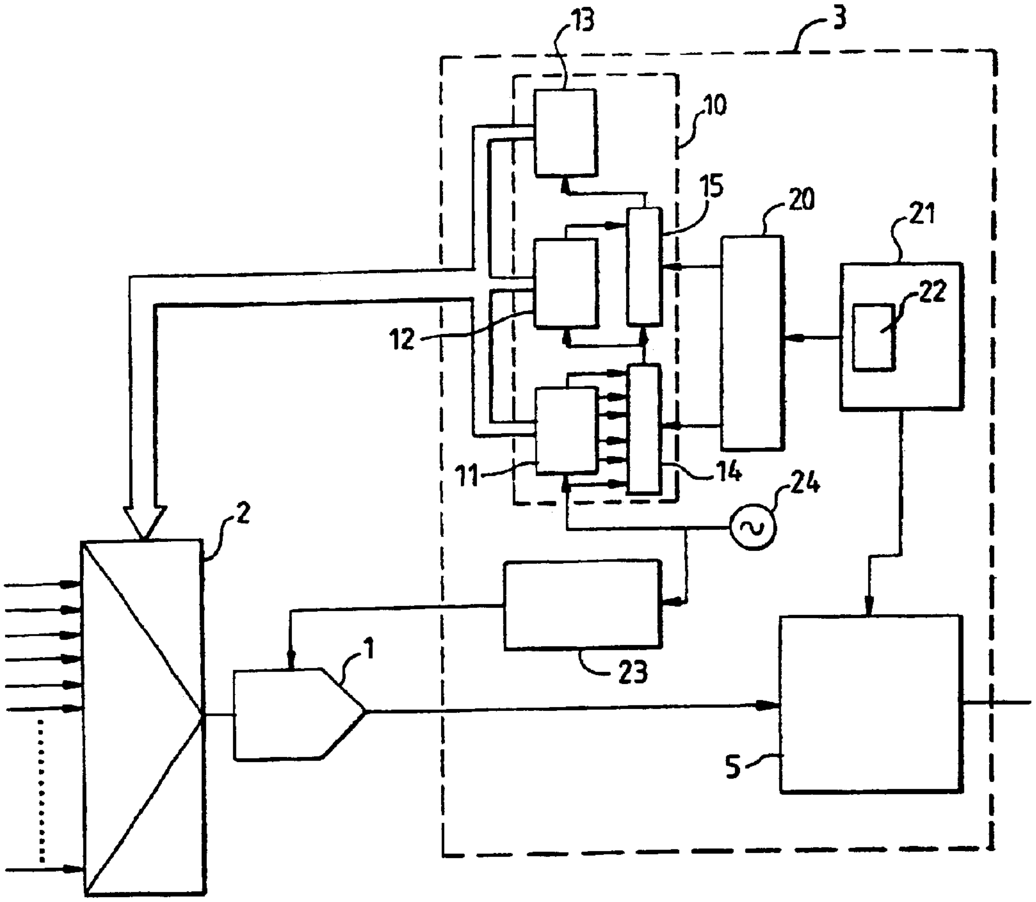

The acquisition of several distinct analogue quantities by an electronic digital processing system, is often effected, as represented in FIG. 1, with the aid of an interface circuit essentially comprising:

- an analogue/digital converter 1,
- an analogue multiplexer 2 with multiple inputs, which is placed in front of the input of the analogue/digital converter, and
- a sequencing handler 3 controlling the operations of the analogue multiplexer 2 and of the analogue/digital converter 1.

The sequencing handler 3 generally comprises a microcontroller 4 catering for the management of the data acquisition sequences, that is to say the addressing of the multiplexer 2 so as to scan its inputs, and the determination of the instants of conversion of the analogue/digital converter 1. This microcontroller 4 is associated with a memory 5 catering both for the storage of the digital data originating from the analogue/digital converter 1, the time required for their exploitation by a user electronic digital processing system 6, and the storage of the program for managing the microcontroller 4.

This type of architecture for a device for acquiring several distinct analogue quantities makes it, possible to minimize the hardware and more particularly the number of analogue/digital converters. By virtue thereof, it is possible to measure certain systematic or slowly varying errors in the analogue chain by periodic acquisition of known quantities. It is commonly used in different contexts with a changing mapping for the inputs of the multiplexer which are actually hard-wired.

Each case would involve a particular adaptation of the logic structure of the sequencing handler so as to accommodate the mapping of the inputs of the multiplexer if one wished to avoid needless scanning of the non hard-wired inputs of the multiplexer. Indeed, hitherto, adaptation to the context on the basis solely of the program for managing the microcontroller 4 led to a voluminous management program demanding a memory 5 of prohibitive capacity.

A sequencing handler is proposed here for the successive measurements of several distinct quantities, by way of multiplexers possibly having a large variety of mappings for their inputs which are actually hard-wired, while remaining driveable with the aid of a compact program requiring only restricted memory space.

This handler takes into account the fact that the order of acquisition of the distinct quantities is often invariable and is often obtained by monotonic scanning of the measurement inputs by means of a counter. It also takes into account the fact that the multiplexers are constructed, in most cases, of an assembly of switches connected together according to a staged arrangement, this staged arrangement making it possible to reduce the overall number of switches for the same number of inputs.

It comprises, in the customary manner, a global counter 10 for addressing all the inputs of the multiplexer 2, which global counter is obtained by chaining elementary counters 11, 12, 13 each addressing one of the stages of switches of the multiplexer. However, this global counter 10 has specific characteristics rendering it reconfigurable at will.

The elementary counter 11 catering for the addressing of the first stage of switches of the multiplexer, that of lower level which is closest to the inputs of the multiplexer 2, is equipped with a controllable circuit 14 for adjusting its capacity or counting cycle length whereas the elementary switch or switches 12 catering for the addressing of the intermediate stages of switches are doubled up with controllable shunting circuits 15.

This reconfigurable global counter 10 can be embodied in hard-wired logic or, in a more customary manner, on the basis of a bank of memory registers and of logic circuits making it possible to manipulate their contents, as customarily found in microcontrollers. It is associated, within the sequencing handler, with a configuration monitoring circuit 20.

The configuration monitoring circuit 20 of the global counter 10 is controlled by a sequencer 21. The latter has an access to the memory 5 from which it retrieves reconfiguration instructions which are stored there, and possesses means 22 for interpreting reconfiguration instructions, which are interposed in front of the configuration monitoring circuit 20.

In addition to these various elements, the sequencing handler 3 also comprises means 23 for driving the analogue/digital converter 1 and a clock circuit 24 delivering pulses for counting and for clocking the taking of samples by the analogue/digital converter 1.

The reconfiguration instructions use a dynamic context and a variable-length binary coding.

The dynamic context is defined by the steady or unsteady state of a mode of repetition or of retention of the capacity or of the length of the counting cycle of the elementary counter of lower level and by the active or inactive states of the shunting circuits of the intermediate elementary counters. It is tagged in the sequencer 21, at the level of the means 22 for interpreting the reconfiguration instructions, with the aid of information bits featuring in a context register updated as and when the reconfiguration instructions are received, interpreted and executed. It makes it possible to select the reconfiguration instructions which are applicable at the moment depending on the situation. This selection decreases the number of possible confusions between the reconfiguration instructions and makes it possible to shorten the code words which are allocated to them.

The variable-length binary coding brings together code words for activating or for inhibiting the repetition mode which is disabled by default, code words for adjusting the capacity or the length of the counting cycle of the elementary counter of lower level, code words for activating or for inhibiting the shunting circuits of the intermediate elementary counters, the said shunting circuits being inactive by default, and an end code word indicating the end of a program for the acquisition of measurements.

The shortest code words are reserved for the most frequent instructions and the longest code words for the least used instructions. Thus, the longest code word is reserved for the end instruction of a string of reconfiguration instructions.

Moreover, whenever the context so permits, that is to say whenever there is no ambiguity, a start of code word bit identical to the end bit of the immediately preceding code word is not repeated but reconstructed by the circuit for interpreting the instructions for reconfiguring the drive circuit. This makes it possible to further reduce the length of a string of code words to be stored.

When the number of distinct analogue quantities to be acquired is several tens, a pyramidal organization with three stages of cascaded switches is amply sufficient for the multiplexer 2. Indeed, such an organization, with a first stage occupied by a row of elementary multiplexers with eight inputs redirected to a single output, with a second less populated stage, occupied by a row of multiplexers with 16 inputs redirected to a single output, and with a third stage occupied by an elementary multiplexer with 16 inputs redirected to a single output, it is possible to access 8×16×16 or 2,048 distinct analogue quantities, this being considerably higher than the conceivable requirements, limitations appearing well before because of the growing complexity of the hard-wiring.

Hence, in the examples given subsequently with regard to FIGS. 3 and 4, one will limit oneself to multiplexers 2 organized in this way, as three stages 30, 31, 32 of cascaded switches, with a first stage of switches of lower level, that which is in contact with its inputs, consisting of a row of elementary multiplexers with at most eight inputs redirected to a single output and which are addressable by a three-bit binary word, with a second stage of switches which consist of a less populated row of elementary multiplexers having 16 inputs redirected to a single output and which are addressable by a four-bit binary word and with a third and last stages of switches consisting of an elementary multiplexer having 16 inputs redirected to a single output which is addressable by a four-bit binary word of course, this is not a limitation, the number of stages of cascaded switches possibly being modified upwards or downwards together with the number of inputs of the elementary multiplexers of each stage.

The monotonic scanning of all the possible inputs of multiplexers of this kind can be achieved with an addressing by means of a global counter consisting of a chain of three elementary counters 11, 12, 13 which deliver, the first 11, the three bits required for the addressing of the switches of the first stage, which are closest to the inputs of the multiplexer 2, the second 12, the four bits required for the addressing of the second stage of switches and the third, the four bits required for the addressing of the switches of the third stage, which are closest to the output of the multiplexer 2.

It is then proposed that, so as to restrict the scanning as far as possible to the inputs of the multiplexer 2 which are actually used, an elementary counter 11 having an adjustable counting capacity of 1, 2, 4 or 8 be used as elementary counter 11 of lower level addressing the stage 30 of switches which is closest to the inputs of the multiplexer, and that the second elementary counter 12 of the intermediate level be doubled up by a controllable shunting circuit 15.

With this make-up, the global counter for addressing the multiplexer can take, on command, various configurations as a function of the counting capacity 1, 2, 4, 8 chosen for its elementary counter 11 of first level and of the active or passive state of the controllable shunting circuit 15.

The possibility of adjusting the length of the counting cycle of the first elementary counter 11 makes it possible to use just one, two or four inputs of each of the elementary multiplexers of the first stage of the multiplexer 2, the possibility of using just one input amounting to purely and simply shunting the, relevant elementary multiplexer and to replacing it by a simple connection.

The possibility of shunting or not shunting the second elementary counter 12 makes it possible to not use certain elementary multiplexers of the second stage of the multiplexer 2, this amounting purely and simply to shunting these elementary multiplexers of the second stage and to replacing them by a direct connection.

These various configurations are obtained, as indicated previously, with the aid of reconfiguration instructions calling upon a dynamic context.

The dynamic context is identified here by the values taken by the two bits of a context register, one signalling the active or inactive state of a repetition mode, the other signalling the activation or inhibition state of the controllable circuit 15 for shunting the second intermediate elementary counter 12.

The binary code words used for the reconfiguration instructions are here:

0 for a configuration retention instruction.

This code word can only be used when the repetition mode is enabled. The number of zeroes indicates, in this case, the number of times that the repetition is to be applied.

1 for an end of repetition mode instruction.

This code word can only be used when the repetition mode is enabled since it serves to disable this mode. It brings to an end a sequence of zeroes indicating a number of repetitions and must be used as a separator when the following code word does not begin with the sequence 01.

01 for a start of repetition mode instruction.

This code word indicates both the start of a repetition mode and the repetition of the last explicit code word.

When the repetition mode is enabled, the following code word must necessarily begin with a 0, the sequence 11 being prohibited. This limitation means that the repetition mode must only be enabled if the number of repetitions of one and the same order exceeds 2. In the converse case, one will merely repeat the code word to be replayed, this being less expensive in terms of coding bits. By default, at the start of a sequence of code words, the repetition mode is inactive.

001 for an instruction for adjusting the counting capacity of the elementary counter 11 of first level to 1.

This code word indicates a sequence of a measurement followed by a rezeroing of the elementary counter 11 of first level so that it instigates a new counting cycle.

This code word does not allow automatic exit from the repetition mode and must be preceded by the code word 1 if it follows on from a repetition sequence where the repetition mode has been activated.

011 for an instruction for adjusting the counting capacity of the elementary counter 11 of first level to 2.

This code word indicates a sequence of two measurements, followed by a rezeroing of the elementary counter 11 of first level so that it instigates a new counting cycle.

This code word beginning with the sequence 01 can bring a repetition mode to an end. In this case, the starting 0 of this code word is also interpreted as the last 0 of the repetition sequence.

This allows a contraction of the sequence of code words.

0011 for an instruction for adjusting the counting capacity of the elementary counter 11 of first level to 4.

This code word indicates a sequence of four measurements, followed by a rezeroing of the elementary counter 11 of first level so that it instigates a new counting cycle.

This code word does not allow automatic exit from the repetition mode and must be preceded by the code word 1 if it follows on from a repetition sequence where the repetition mode has been activated.

0111 for an instruction for adjusting the counting capacity of the elementary counter 11 of first level to 8.

This code word indicates a sequence of eight measurements, followed by a rezeroing of the elementary counter 11 of first level so that it instigates a new counting cycle.

This code word beginning with the sequence 01 can bring a repetition mode to an end. In this case, the starting 0 of this code word is also interpreted as the last 0 of the repetition sequence.

This allows a contraction of the sequence of code words.

0001 for an instruction for changing the active or inactive state of the controllable circuit 15 for shunting the elementary counter 12 of second level.

By default, at the start of a sequence, the controllable circuit 15 for shunting the elementary counter 12 of second level is in the inactive state.

When it is encountered for the first time, this code word makes it possible to shunt the elementary counter 12 of second level. When it has been executed, the overflow or end of counting cycle pulses for the elementary counter 11 of first level are applied directly to the elementary counter 13 of third level. Incidentally, they serve for the rezeroings of the elementary counters 11, 12 of first and of second level.

0000 for an end of code words sequence instruction.

This code word can only be used when the repetition mode is not enabled. It indicates the end of the program for the acquisition of measurements. It makes it possible to terminate a sequence of codes before reaching the default condition (loopback of a configuration instructions pointer to the value 0 and reinitialization of the context register).

The memory 5 which serves for the short-term storage of the numerical results of the acquisitions of analogue quantities, the time at which they are taken into account by the user digital exploitation system, and for the long-term storage of the sequence of code words conveying the reconfiguration instructions corresponding to a scan of all the analogue quantities is a RAM random access memory. When the number of distinct quantities to be acquired is a few tens, as is the case for the examples which will be described, this random access memory can be organized as binary words of 16 bits and have a capacity of the order of 128 words of 16 bits. These 128 words are divided into two groups, a first group of n words which is reserved for the storage of the numerical samples resulting from the acquisitions of the analogue quantities and a second group of N-n words which is reserved for the storage of the sequence of reconfiguration instructions; customizing the scanning chosen so as to exclude therefrom the inputs of the multiplexer not leading to the sought-after analogue quantities.

If the writing of the numerical samples of the analogue quantities acquired is performed in the random access memory 5 in ascending order of addresses starting from address 0, it is preferable to store the sequence of reconfiguration instructions in descending order of addresses starting from N. In this way, one makes certain that N-n words are available to customize the scan.

It is also preferable to put in place an automatic saturation procedure during the acquisition of digital samples originating from the analogue/digital converter so as to prohibit the binary words of values h000 or hFFFF, these latter being systematically replaced by the values h0001 or hFFFE. This subterfuge makes it possible to keep the two codes free so as to signal to the means 23 for driving the analogue/digital converter 1, a conversion problem (code hFFFF) and a non-refresh since the last read (code h0000).

Figure 3:
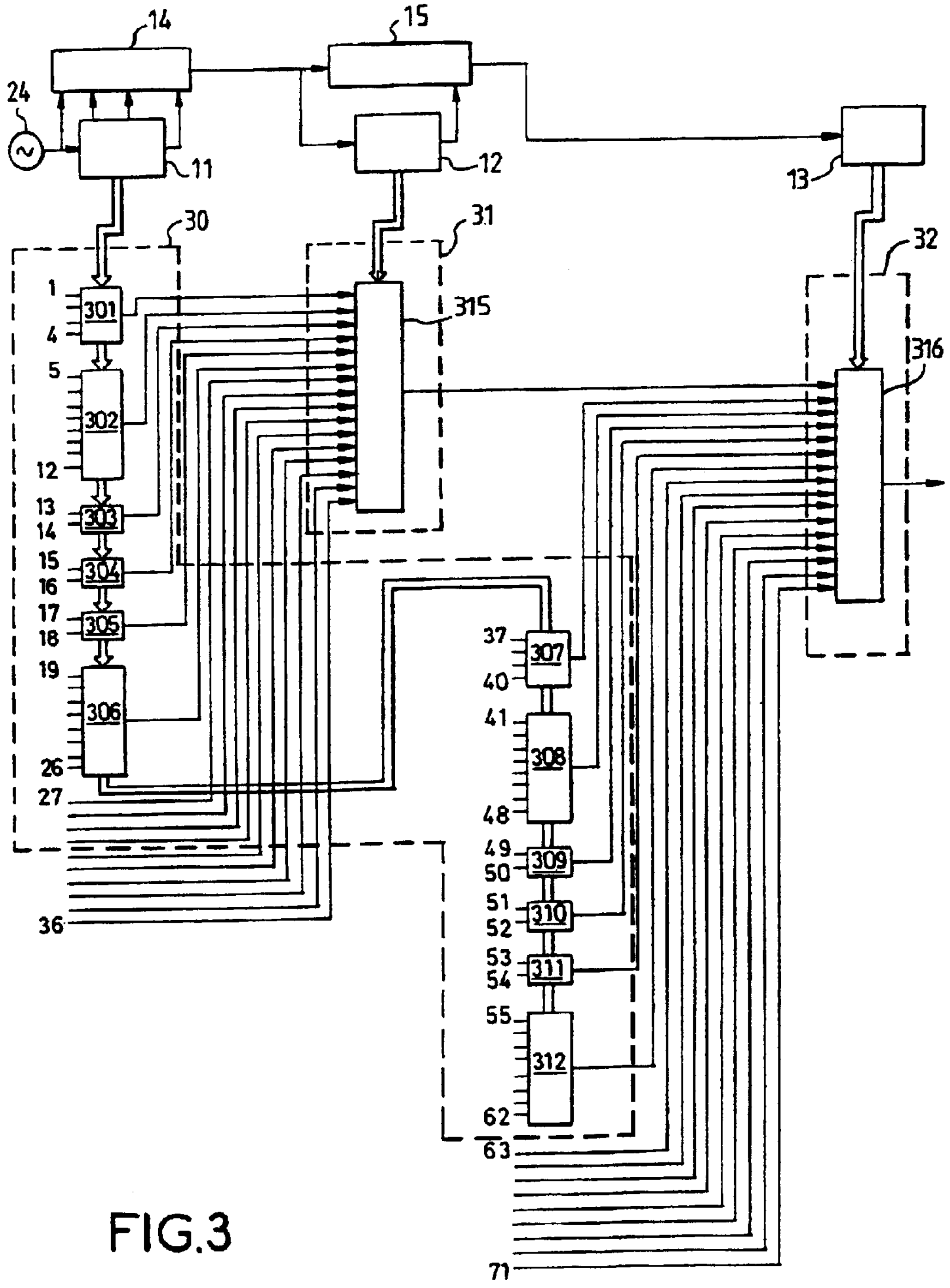
- FIGS. 3 and 4 are diagrams illustrating two different examples of multiplexers with staged structure having a certain number of non hard-wired inputs, and to which the invention is applied.

FIG. 3 gives an exemplary mapping of the inputs actually used of the multiplexer 2 in a first application context. There are only 71 of them, whereas there could be 2,048 of them. The addressing is effected, as previously, with the aid of a chain of three elementary counters 11, 12, 13, the first 11 having a counting capacity of 8 and the other two 12 and 13 having a counting capacity of 16.

The first stage 30 of switches, closest to the inputs, comprises just one row of twelve elementary multiplexers which are actually hard-wired, some 303, 304, 305, 309, 310, 311 having two inputs, others 301, 307 four inputs, and others finally, 302, 306, 306[sic], 312 eight inputs.

The second stage 31 of switches reduces to a single hard-wired elementary multiplexer 315 with 16 inputs. This elementary multiplexer 315 brings together the outputs from a subset of elementary multiplexers (301, 302, 303, 304,

305, 306) of various capacities in terms of number of inputs, of the first stage 30 and directly accesses a certain number of inputs (27 to 36).

The third stage 32 of switches also reduces to a single hard-wired elementary multiplexer 316 with 16 inputs. The latter brings together the output of the elementary multiplexer 315 of the second stage 31 with the outputs of the remaining elementary multiplexers (307, 308, 309, 310, 311, 312) of the first stage 30 which also have various capacities in terms of number of inputs, and directly accesses a certain number of inputs (63 to 71) which are not serviced by the first and second stages 30 and 31 of the switches.

The sequence of reconfiguration instruction code words making it possible to scan only the existing inputs of the multiplexer 2 represented in FIG. 3, requires only 63 bits for its programming, i.e. just four words of 16 bits in memory 5. It is defined by the binary string:

011 0111 011 01 0111 001 01 00000000 1 0001 0011 0111 0111 01 011 001 01 0000000

Its effect is as follows:

The first code word recognized in the sequence is 0011 since the first 0 is implicit. This is because the repetition mode is disabled at the start of the sequence thereby eliminating the possibility of the codes having a 0 and 1 bit and all the other code words beginning with a 0. Advantage is taken of this so as to presuppose this 0 and reduce the length of a sequence of code words. Thus, the code word to be recognized at the start of the sequence comprises at least two bits, one of which is a 0 at the start. The assumption is therefore made that the code word comprises at least the two digits 00. These two digits do not correspond to any legal instruction code. From this it is deduced that the code word must be longer. One then considers the word 001. The latter comprises a 1, it must then be followed by a 0 like all legal instruction codes containing a 1. This is not the case, hence the code word must be longer. One then considers the code word 0011. This is the code word corresponding to an instruction for adjusting the length of the counting cycle of the first elementary counter 11 to the value 4. This cycle is run, causing, on the one hand, the scanning of the inputs 1 to 4 of the first elementary multiplexer 301 of the row of the first stage of switches of the multiplexer 2 corresponding to the general addresses: XX0 0000 0000 delivered by the global counter and on the other hand the incrementation of the second elementary counter 12. It is noted here that the absence of possible confusion is used to make some of the digits of the sequence of instruction codes implicit, doing so for the purpose of decreasing the size of the sequence and reducing the space which it occupies in memory.

The second code word recognized is 0111. This is because, since the repetition mode is disabled, the instruction has more than one digit. As before, the instruction comprises a 1 in the second position and hence it must terminate in a 1 preceding a 0. It is therefore the code 0111 corresponding to an instruction for adjusting the counting cycle of the first elementary counter 11 to the value 8. This cycle is run, causing the scanning of the inputs 5 to 12 of the second elementary multiplexer 302 of the row of the first stage of switches of the multiplexer 2 corresponding to the general addresses XXX 1000 0000 and a new incrementation of the second elementary counter 12.

The third code word recognized is 011 for the same reasons as before. It corresponds to an instruction for adjusting the counting cycle of the first counter 11 to the value 2. This cycle is run, causing the scanning of the inputs 13, 14 of the third elementary multiplexer 303 of the row of the first stage of switches of the multiplexer 2 corresponding to the general addresses X00 0100 0000 and a new incrementation of the second elementary counter 12.

The fourth code word recognized is 01 again for the same reasons as before. It corresponds to an order for activation of the repetition mode twinned with a repetition command. The length of the counting cycle of the first elementary counter 11 remains fixed at the value 2. This counting cycle is run, causing the scanning of the inputs 15, 16 of the fourth elementary multiplexer 304 of the row of the first stage of switches of the multiplexer 2 corresponding to the general addresses X00 1100 0000 and a new incrementation of the second elementary counter 12. Simultaneously, the bit of the context register corresponding to the repetition mode is enabled.

The fifth code word recognized is 0 since the only legal code words in the presence of an enabled repetition mode are code words with one digit. This code word corresponds to the retaining of the preceding configuration. The length of the counting cycle of the first elementary counter 11 remains fixed at the value 2. This counting cycle is run again, causing the scanning of the inputs 17, 18 of the fifth elementary multiplexer 305 of the row of the first stage of switches of the multiplexer 2 corresponding to the general addresses X00 0010 0000. The bit of the context register corresponding to the repetition mode remains enabled.

The sixth code word recognized is again 1 since the only legal code words in the presence of an enabled repetition mode are code words with one digit. This code word corresponds to a repetition mode halt instruction. It causes a change of state of the bit of the context register corresponding to the repetition mode which takes the disabled value. The execution of this instruction is immediately followed by the consideration of the following code word, even before the addressing of another input of the multiplexer 2.

The seventh code word recognized is 0111. This is because one is in a context of disabled repetition mode which implies that the legal code words have more than one digit. Since the first digit encountered has the value 1, the sought-after code word must terminate with a 1 preceding a 0. The sought-after code word therefore terminates with 11. This is an incomplete code word since there is no legal instruction code of this type. The start of the code word must be sought upstream. Upstream, one finds another 1. The code word sought therefore terminates with 111. The same problem arises as previously since there is no legal instruction code word of this type. Again it is an incomplete code word which must be completed upstream. Upstream one finds a 0, thus prompting the testing of the number 0111. The latter corresponds to a legal code word and the corresponding instruction for adjusting the counting cycle of the first elementary counter 11 to the value 8 is executed. It is followed by the running of the counting cycle of the first elementary counter and by the scanning of the inputs 19 to 26 of the sixth elementary multiplexer 306 of the row of the first stage of switches of the multiplexer 2 corresponding to the general addresses XXX 1010 0000 and a new incrementation of the second elementary counter 12.

The absence of any possible confusion has made it possible not to repeat in the sequence of instructions the first two digits of the seventh code word which were identical to the last two digits which preceded them. This conspires to further reduce the length of the sequence of instructions again for the purpose of saving space in the memory 5. In the binary string corresponding to the sequence of instructions which has been given previously, the non-repeated bits have been tagged by thicker and bolder writing.

The eighth code word recognized is 001. This is because, since the repetition mode is disabled, the sought-after code word has more than one digit. It necessarily has more than two digits since the code word 00 is not legal. The sought-after code word therefore necessarily comprises the digits 001. Since it comprises a number 1, it must be followed by a 0. This is the case. Hence the sought-after code word is 001. The latter corresponds to an instruction for adjusting the counting cycle of the first elementary counter 11 to the value 1. The execution of this instruction leads to the first elementary counter 11 being retained at 0 while sending an incrementation pulse to the second elementary counter 12. This results in the scanning of the input 27 of the multiplexer 2 whose wiring does not go through any switch of the first stage 30 but solely through switches of the second and third stages 31 and 32. This input 27 corresponds to the general addresses XXX 0110 0000.

The ninth code word recognized is 01. It corresponds to a repetition mode activation instruction twinned with a repetition command. This results in a scan of the input 28 of the multiplexer 2 which benefits from a similar wiring to the input 27.

The following eight code words recognized, the tenth to the seventeenth, are 0. They are gleaned from the string of eight 0s encountered and correspond to the same instruction for retaining the preceding configuration. They bring about the scanning of the inputs 29 to 36 of the multiplexer 2 which benefit from similar wirings to that of the input 27. These inputs 29 to 36 as well as the input 27 have the general addresses XXX 1110 0000 to XXX 1111 0000. The end of the execution of the retention instruction corresponding to the seventeenth code word causes the natural incrementation of the third elementary counter 13.

The eighteenth code word recognized is 1. It corresponds to the exiting of the repetition mode.

The nineteenth code word recognized is 0001. It corresponds to a command for activating the shunting circuit 15 of the second elementary counter 12. The execution of this command incidentally brings about the rezeroings of the first and second elementary counters 11, 12.

The twentieth code word recognized is 0011. It corresponds to an instruction for adjusting the length of the counting cycle of the first elementary counter 11 to the value 4. This cycle is run, causing the scanning of the inputs 37 to 40 of the seventh elementary multiplexer 307 of the row of the first stage 30 of switches of the multiplexer 2 corresponding to the general addresses XX0 0000 1000 and a new incrementation of the third elementary counter 13 since the shunting circuit 15 is active.

The twenty-first code word recognized is 0111. It corresponds to an instruction for adjusting the length of the counting cycle of the first elementary counter 11 to the value 8. This cycle is run, causing the scanning of the inputs 41 to 48 of the eighth elementary multiplexer 308 of the row of the first stage 30 of switches of the multiplexer 2 corresponding to the general addresses XXX 0000 0100 and a new incrementation of the third elementary counter 13 since the shunting circuit 15 is active.

The twenty-second code word recognized is 011. This is the code word corresponding to an instruction for adjusting the length of the counting cycle of the first elementary counter 11 to the value 2. This counting cycle is run, causing the scanning of the inputs 49 and 50 of the ninth elementary multiplexer 309 of the row of the first stage of switches of the multiplexer 2 corresponding to the general addresses: X00 0000 1100 delivered by the global counter and the incrementation of the third elementary counter 13 since the shunting circuit 15 is still active.

The twenty-third code word recognized is 01. It corresponds to an order for-activating the repetition mode twinned with a repetition command. The length of the counting cycle of the first elementary counter 11 remains fixed at the value 2. This counting cycle is run, causing the scanning of the inputs 51 and 52 of the tenth elementary multiplexer 310 of the row of the first stage of switches and the multiplexer 2 corresponding to the general addresses X00 0000 0010 and an incrementation of the third elementary counter 13. Furthermore, the bit of the context register corresponding to the repetition mode is enabled.

The twenty-fourth code word recognized is 0. It corresponds to a repetition instruction. The length of the counting cycle of the first elementary counter 11 remains fixed at the value 2. This counting cycle is run, causing the scanning of the inputs 53 and 54 of the eleventh elementary multiplexer 311 of the row of the first stage of switches of the multiplexer 2 corresponding to the general addresses X00 0000 1010 and a new incrementation of the third elementary counter 13.

The twenty-fifth code word recognized is 1. It corresponds to an end of repetition mode instruction. It causes the changing of the state of the bit of the context register corresponding to the repetition mode which takes the disabled value. The execution of this instruction is immediately followed by the consideration of the following code word, even before the addressing of another input of the multiplexer 2.

The twenty-sixth code word recognized is 0111. This recognition results from an analysis identical to that undertaken for the seventh code word, which leads to the supplementing of the binary word examined with the last two digits 01 of the preceding code words which have not been repeated out of a desire to reduce the length of an instruction sequence. This is an instruction for adjusting the counting cycle of the first elementary counter 11 to the value 8. It is followed by the running of the counting cycle of the first elementary counter and the scanning of the inputs 55 to 62 of the twelfth elementary multiplexer 312 of the row of the first stage of switches of the multiplexer 2 corresponding to the general addresses XXX 0000 1110 and a new incrementation of the third elementary counter 13 since the shunting circuit 15 is still active.

The twenty-seventh code word recognized is 001. It corresponds to an instruction for adjusting the counting cycle of the first elementary counter 11 to the value 1. The execution of this instruction leads to the first elementary counter 11 being retained at zero while sending an incrementation pulse to the third elementary counter 13. This results in the scanning of the input 63 of the multiplexer 2 whose wiring does not pass through any switch of the first or of the second stage 30 or 31 but solely through switches of the third stage 32. This input 63 corresponds to the general addresses XXX XXXX 1110.

The twenty-eighth code word recognized is 01. It corresponds to an order for activating the repetition mode twinned with a repetition command. The length of the counting cycle of the first elementary counter 11 remains fixed at the value 1. The execution of this activation order leads to the first elementary counter 11 being retained at zero while sending an incrementation pulse to the third elementary counter 13 and enabling the bit of the context register corresponding to the repetition mode. This results in the scanning of the input 64 of the multiplexer 2 whose wiring does not pass through any switch of the first or of the second stage 30 or 31 but solely through switches of the third stage 32. This input 64 corresponds to the general addresses XXX XXXX 0001.

The following seven code words recognized, the twenty-ninth to the thirty-fifth, are 0. They are gleaned from the string of the last seven 0s encountered and correspond to the same instruction for retaining the preceding configuration. They bring about the scanning of the inputs 65 to 71 of the multiplexer 2 which benefit from wirings similar to those of the inputs 63, 64. They have general addresses XXX XXXX 1001 to XXX XXXX 1111.

The end of scanning is caused implicitly by the overflowing of the chain of elementary counters 11, 12, 13 which occurs after the polling of the last input numbered 71.

Figure 4:
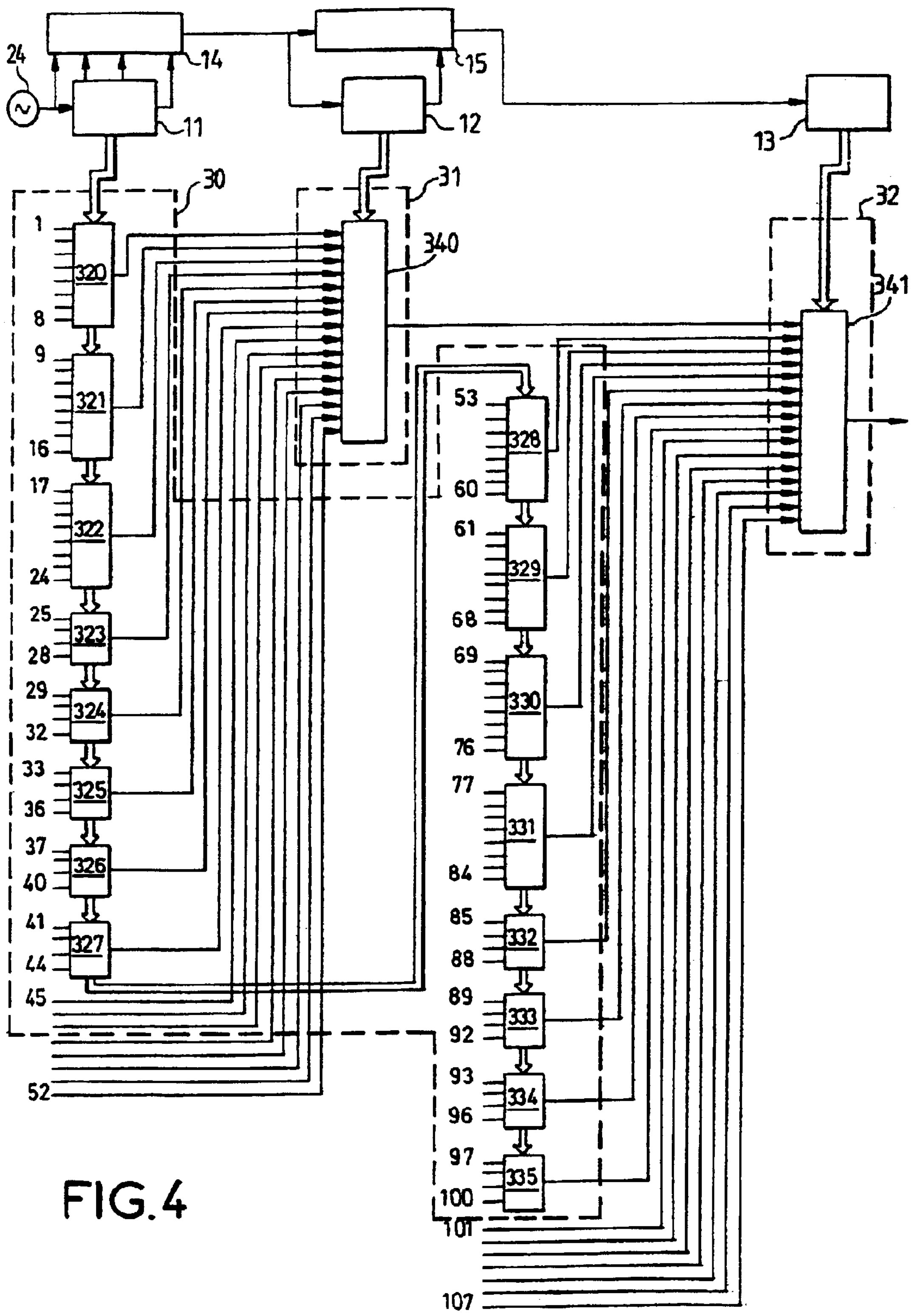

FIG. 4 gives another exemplary mapping of the inputs actually used of the multiplexer 2 in a second application context. In this second application context, 107 inputs are actually used. The multiplexer still has three stages 30, 31, 32 of switches addressed by a chain of three elementary counters 11, 21, 13, the first 11 possibly having a counting capacity of 8 and the other two 12 and 13 having a counting capacity of 16 allowing a theoretical addressing of 2048 inputs.

The first stage 30 of switches, closest to the inputs, comprises just one row of sixteen actually hard-wired elementary multiplexers, some 323, 324, 325, 326, 327, 332, 333, 334, 335 having four inputs and others 320, 321, 322, 328, 329, 330, 331 eight inputs.

The second stage 31 of the switches reduces to a single hard-wired elementary multiplexer 340 with sixteen inputs. This elementary multiplexer 340 brings together the outputs of a subset of elementary multiplexers (320, 321, 322, 323, 324, 325, 326, 327) of various capacities in terms of number of inputs, of the first stage 30 and directly accesses a certain number of inputs (45 to 52) which are not serviced by the first stage of switches.

The third stage 32 of switches also reduces to a single hard-wired elementary multiplexer 341 with sixteen inputs. It brings together the output of the elementary multiplexer 340 of the second stage 31 with the outputs of the remaining elementary multiplexer (328, 329, 330, 331, 332, 333, 334, 335) of the first stage 30 which also have-various capacities in terms of number of inputs, and directly accesses a certain number of inputs (101 to 107) which are not serviced by the first and second stages 30 and 31 of switches.

The sequence of reconfiguration instruction codes making it possible to scan only the existing inputs of the multiplexer 2 represented in FIG. 4, requires only 60 bits for its programming, i.e. only four words of 16 bits in the memory 5. It is defined by the binary string: 111 01 0 1 001 01 000 1 001 01 000000 1 0001 0111 01 00 1 0011 01 00 1 001 01 00000

Its effect can be studied, like that of the preceding sequence of instruction codes used for the scanning of the existing inputs of the multiplexer represented in FIG. 3, by examining in detail the consequences on the global addressing of each of the instructions following one another in the sequence. Such a study does not pose any more difficulties than in the preceding case. Since it is relatively lengthy, it will not be reiterated but simply summarized by a table at the same time showing the alterations, in decimal, in the states of the three stages of elementary counters catering for the global addressing of the multiplexer represented in FIG. 4 and the inputs addressed, as a function of the instructions executed as and when they are identified in the binary string.

| | Global counter | | | |
|---|---|---|---|---|
| Sequence of codes | 1st stage | 2nd stage | 3rd stage | Inputs |
| 111 (the first 0 is implicit) | 0 . . . 7 | 0 | 0 | 1–8 |
| 01 (repetition mode enabled) | 0 . . . 7 | 1 | 0 | 9–16 |
| 0 | 0 . . . 7 | 2 | 0 | 17–24 |
| 1 0011 01 000 | 0 . . . 3 | 3 . . . 7 | 0 | 25–44 |
| 1 001 01 000000 | 0 | 8 . . . 15 | 0 | 45–52 |
| 1 0001 0111 01 00 | 0 . . . 7 | 0 | 1 . . . 4 | 53–84 |
| 1 0011 01 00 | 0 . . . 3 | 0 | 5 . . . 8 | 85–100 |
| 1 001 01 00000 (implicit end of sequence) | 0 | 0 | 9 . . . 15 | 101–107 |

The data acquisition devices just described are advantageously embodied in the form of integrated circuits or of parts of integrated circuits, all the addressing, sequencing or driving functions being obtained from combinations of cells of hard-wired logic circuits and/or of cells of sequential logic circuits according to the customary technique for designing integrated circuits.

What is claimed is:

1. Process for sequential addressing of inputs of is multiplexer that includes plural stages of switches from its inputs to its output and that is addressed at a level of each stage of switches by an elementary counter provided with a counting input, with a reinitialization input, with counting outputs controlling the switches of a relevant stage and with an overflow output, and chained to the elementary counters of lower stages of switches by linking its counting input to an overflow output of the elementary counter of the lower stage to constitute a global addressing counter, the process comprising:

using, for addressing of the stage of switches of lower level closest to the inputs of the multiplexer, an elementary counter having a capacity or counting cycle length that can be adjusted on command;

providing controllable circuits for shunting the elementary counters of the stages of intermediate switches;

periodically generating a counting order for the counting input of the elementary counter of the stage of switches of lower level to describe successive counting cycles;

altering a configuration of the global addressing counter, at a start of each of the counting cycles of the elementary counter of the stage of switches of lower level, by acting on a length of a forthcoming counting cycle of this elementary counter of the stage of switches of lower level as well as on in-activity shunting circuits of the elementary counters of the stages of intermediate switches.

2. Process according to claim 1, wherein successive reconfigurings of the global counter for addressing the multiplexer occur in a scanning sequence for the inputs of the multiplexer, and are defined with aid of a string of instructions written in a binary reconfiguring language comprising code words for adjusting a length of the counting cycle of the elementary counter catering for addressing of the stage of switches of lower level and code words for activating or inhibiting the controllable shunting circuits of the elementary counters catering for addressing of the stages of intermediate switches.

3. Process according to claim 2, wherein the language for reconfiguring the global counter for addressing the multiplexer also comprises code words for activating or inhibiting a mode for repeating or for retaining the length of the counting cycle of the elementary counter catering for the addressing of the stage of switches of lower level and a repetition code word valid only when the repetition mode is active.

4. Process according to claim 3, wherein various binary code words of the language for reconfiguring the global counter for addressing the multiplexer all begin with a 0 with exception of a code word for inhibiting a repetition mode.

5. Process according to claim 3, wherein the repetition code word in the language for reconfiguring the global counter for addressing the multiplexer is logical 0.

6. Process according to claim 3, wherein the code word for inhibiting the repetition mode in the language for reconfiguring the global counter for addressing the multiplexer is logical 1.

7. Process according to claim 3, wherein the code word for activating the repetition mode in the language for reconfiguring the global counter for addressing the multiplexer is binary 01.

8. Process according to claim 3, applied to a multiplexer with three stages of switches, wherein the code words for activating and for inhibiting the controllable circuit for shunting the elementary counter addressing the second stage of switches in the language for reconfiguring the global counter for addressing the multiplexer coincide and are expressed by the binary word with four bits 0001, this binary word signifying a change of an active or inactive state of the shunting circuit of the elementary counter addressing the second stage of switches.

9. Process according to claim 2, wherein the language for reconfiguring the global counter for addressing the multiplexer comprises an end code word indicating an end of a string of configuration instructions.

10. Process according to claim 9, wherein an end code word in the language for reconfiguring the global counter for addressing the multiplexer is a string of binary zeroes.

11. Process according to claim 2, wherein the code words of the language for reconfiguring the global counter for addressing the multiplexer are binary code words of variable lengths, the code words most frequently use having shortest lengths.

12. Addressing device for a multiplexer having a staged architecture with plural stages of switches from its input to its output, comprising a global counter including a chaining of elementary counters each addressing a stage of switches of the multiplexer, comprising a global counter with an elementary counter having counting capacity configured to be adjusted on command for the addressing of the stage of switches of lower level closest to the inputs of the multiplexer and with controllable circuits for shunting its elementary counters addressing the stages of intermediate switches, and a handler running a sequence of commands for reconfiguring the counter in accomplishment of its counting cycle.

* * * * *